US008278960B2

(12) United States Patent
McQuirk et al.

(10) Patent No.: US 8,278,960 B2
(45) Date of Patent: Oct. 2, 2012

(54) METHOD AND CIRCUIT FOR MEASURING QUIESCENT CURRENT

(75) Inventors: Dale J. McQuirk, Austin, TX (US); Michael T. Berens, Austin, TX (US); James R. Feddeler, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 553 days.

(21) Appl. No.: 12/487,798

(22) Filed: Jun. 19, 2009

(65) Prior Publication Data

US 2010/0320997 A1 Dec. 23, 2010

(51) Int. Cl.
*G01R 31/26* (2006.01)

(52) U.S. Cl. ............ 324/762.01; 324/76.39; 324/76.48; 324/76.11; 714/724

(58) Field of Classification Search ............... 324/76.16, 324/76.62
See application file for complete search history.

(56) References Cited

U.S. PATENT DOCUMENTS 5,808,476 A 9/1998 Lee et al.
6,118,293 A * 9/2000 Manhaeve et al. ......... 324/750.3
6,239,609 B1 5/2001 Sugasawara et al.
6,255,839 B1 7/2001 Hashimoto
6,323,668 B1 * 11/2001 Hashimoto ................ 324/750.3
6,342,390 B1 1/2002 Wiener et al.
6,348,806 B1 * 2/2002 Okandan et al. ........... 324/750.3
6,664,801 B1 * 12/2003 Palusa ...................... 324/762.09
6,806,726 B2 10/2004 Okada et al.
6,857,093 B2 2/2005 Ooishi
6,891,389 B1 * 5/2005 Walker et al. ............ 324/750.02
7,250,783 B2 7/2007 Hsu et al.
7,276,925 B2 * 10/2007 Dobberpuhl et al. ...... 324/750.3
7,336,088 B2 * 2/2008 Rius Vazquez et al. .... 324/750.3
7,701,280 B2 * 4/2010 Sumita .......................... 327/534
2003/0057987 A1 * 3/2003 Ohlhoff et al. ................ 324/763
2009/0206864 A1 * 8/2009 Gurevitch et al. ............ 324/763

* cited by examiner

*Primary Examiner* — Richard Isla Rodas
(74) *Attorney, Agent, or Firm* — Joanna G. Chiu; Daniel D. Hill

(57) ABSTRACT

A measurement circuit and method for measuring a quiescent current of a circuit under test are provided. The measurement circuit comprises: a comparator having a first input terminal for receiving a reference voltage, a second input terminal coupled to the circuit under test, and an output terminal; a current source having a first terminal coupled to a first power supply voltage terminal, and a second terminal for providing a current to the circuit under test; a first switch having a first terminal coupled to the second terminal of the current source, a second terminal coupled to the circuit under test, and a control terminal coupled to the output terminal of the comparator; and a first counter having a first input terminal coupled to the output terminal of the comparator, a second input terminal for receiving a clock signal, and an output terminal for providing a first counter value associated with the quiescent current.

20 Claims, 4 Drawing Sheets

METHOD AND CIRCUIT FOR MEASURING QUIESCENT CURRENT

BACKGROUND

1. Field

This disclosure relates generally to current measurement, and more specifically, to methods and circuitry for measuring quiescent current.

2. Related Art

Typically, the measurement of quiescent current is used in circuit testing to identify soft defects and state specific defects that can cause circuits to fail. This type of measurement is commonly made with an external tester. However, the use of an external tester to measure quiescent current is typically slow and inaccurate, depending on such factors as availability of special pins, test board capacitance, tester quality, etc. Therefore, an improved method and circuit for testing quiescent current is needed.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
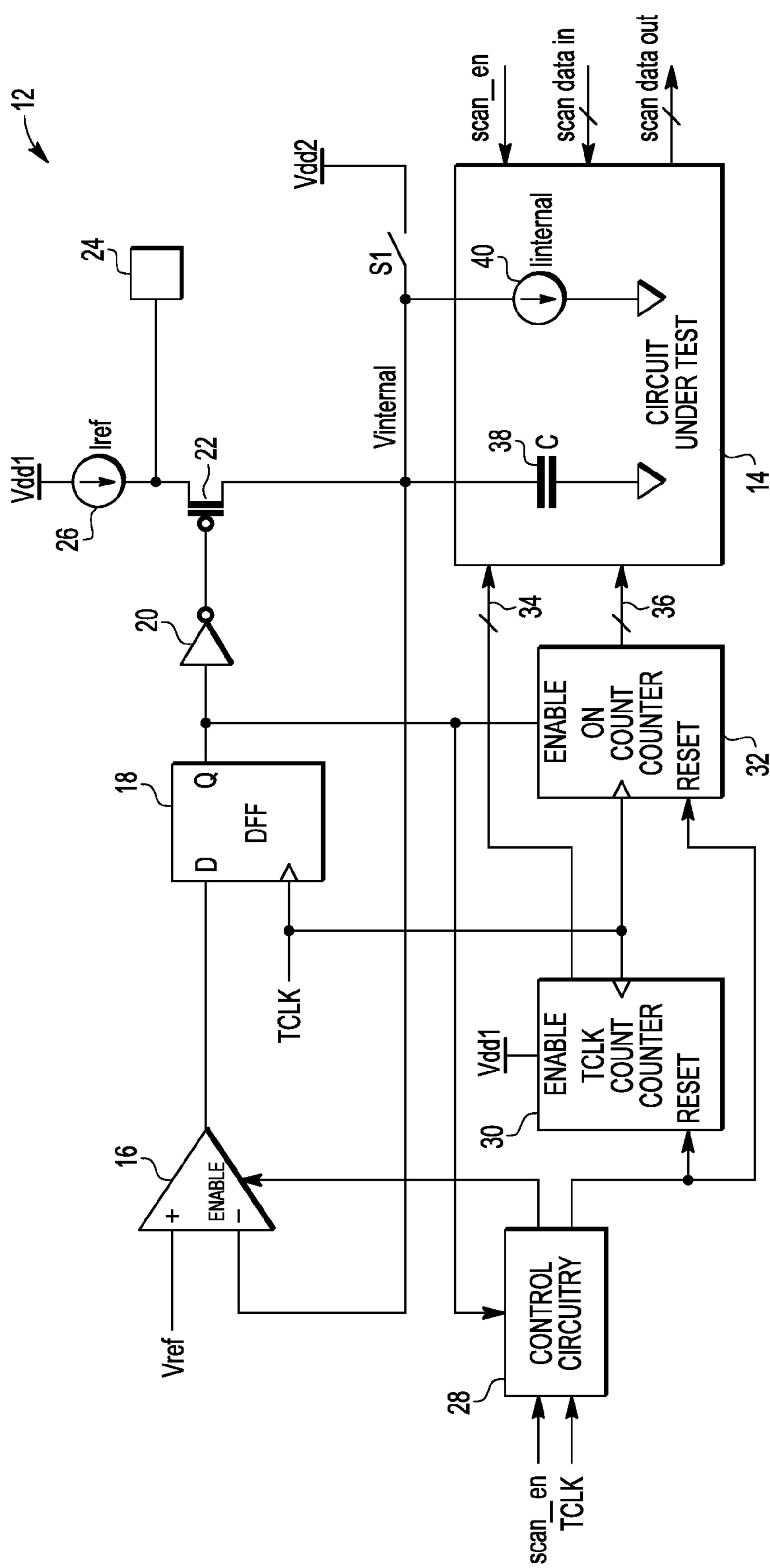
FIG. 1 illustrates, in partial schematic and partial block diagram form, a measurement circuit coupled to a circuit under test, in accordance with one embodiment of the present invention.

In one embodiment, a measurement circuit measures quiescent current (Iddq) of a circuit under test. In one embodiment, the measurement circuit is located on a same integrated circuit (IC) as the circuit under test. The quiescent current is a measurement of current taken when the circuit under test is in an unclocked or static state. Therefore, in one embodiment, the quiescent current for digital logic may be referred to as the leakage current of the circuit under test. In one embodiment, through the use of a comparator, a reference current, a reference voltage, and one or more counters, an n-bit digital value can be generated which represents the quiescent current of the circuit under test with respect to the reference current.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Note also that a switch may be referred to as "closed" or "on" when in its conductive state and as "open" or "off" when in its non-conductive state. Note also that any circuitry, as known in the art, may be used to implement the switches described herein.

FIG. 1 illustrates, in partial schematic form and partial block diagram form, a circuit 10 which includes a measurement circuit 12 and a circuit under test 14. Measurement circuit 12 includes a comparator 16, a D flip flop (DFF) 18, an inverter 20, a current source 26, a PMOS transistor 22, control circuitry 28, a TCLK count counter 30, and an on count counter 32. A positive input of comparator 16 receives a reference voltage, Vref, and a negative input of comparator 16 is coupled to a circuit node, Vinternal. The output of comparator 16 is coupled to a data input, D, of DFF 18. Control circuitry 28 provides an enable signal to an enable input of comparator 16. A test clock (TCLK) is provided to the clock inputs of DFF 18 and counters 30 and 32 and to control circuitry 28. A data output, Q, of DFF 18 is coupled to an input of inverter 20 and to an enable input of on count counter 32, and is also provided to control circuitry 28. An output of inverter 20 is coupled to a control electrode of transistor 22. An enable input of TCLK count counter 30 is coupled to a first power supply, Vdd1. Control circuitry 28 provides a reset signal to reset inputs of counters 30 and 32. Control circuitry 28 receives a scan enable signal, scan_en. Data outputs of each of counters 30 and 32 are provided to circuit under test 14 via conductors 34 and 36, respectively. A first terminal of current source 26 is coupled to Vdd1 and a second terminal of current source 26 is coupled to a first current electrode of transistor 22. A second current electrode of transistor 22 is coupled to Vinternal.

Circuit under test 14 can be any circuit being tested such as, for example, a processor, a portion of a processor, a processor core, a memory, a plurality of logic gates, etc. In one embodiment, circuit under test 14 is digital circuitry. Circuit under test 14 is represented by a capacitive element 38 which represents the load or cumulative capacitance of circuit under test 14 and a current source 40 which represents the internal current of circuit under test 14. Vinternal is coupled to a second power supply, Vdd2, via a switch S1. Capacitive element 38 has a first plate electrode which is coupled to Vinternal and a second plate electrode which is coupled to Vss (also referred to as ground or another power supply). Current source 40 has a first terminal coupled to Vinternal and a second terminal coupled to Vss. Circuit under test 14 receives scan_en and scan data in, and provides scan data out.

In one embodiment, each element of measurement circuit 12 is powered by Vdd1. Also, in the illustrated embodiment, Vdd1 is different from Vdd2. However, in an alternate embodiment, Vdd1 and Vdd2 may be a same voltage supply which, with appropriate circuitry (such as a switch or voltage regulator), can be decoupled from Vinternal while continuing to power measurement circuit 12.

In one embodiment, circuit 10 is implemented on a single integrated circuit. Alternatively, circuit 10 can be implemented using one or more integrated circuits. In one embodiment, portions of circuit 10 may be located external to the remaining portions of circuit 10. For example, switch S1 and Vdd2 may be located external (i.e. off-chip) with respect to circuit under test 14. Also, in one embodiment, counter 30 may be located external to circuit 10 (i.e. off-chip), such as, for example, within an external tester.

In operation, measurement circuit 12 is enabled to perform a measurement of the quiescent current by control circuitry 28. When enabled, comparator 16 compares Vinternal to Vref where DFF 18 outputs a logic level one for each pulse of TCLK for which Vref is greater than Vinternal. (Note that when comparator 16 is enabled to compare Vinternal to Vref, switch S1 is in its open state to decouple Vinternal from Vdd2, and any clocks provided to circuit under test 14 are in a frozen state.) Counter 30 provides a count, over a particular period of time, of the total pulses of TCLK, while counter 32 provides a count, over the same period of time, of the number of TCLK pulses during which the output of DFF 18 is high (e.g. a logic level 1). Note that each time the output of DFF 18 is a logic level 1, the output of inverter 20 becomes a logic level 0, thus turning on transistor 22. When transistor 22 is on, a reference current, Iref, from current source 26 is provided to circuit under test 14. When the output of DFF 18 is a logic level 0, the output of inverter 20 becomes a logic level 1, thus turning off transistor 22 and Iref is not provided to circuit under test 14. Therefore, on count counter 32 counts the number of pulses of TCLK, over the particular period of time, during which Iref is provided to circuit under test 14. At the end of this particular period of time, a ratio of the count value of on count counter 32 to the count value of TCLK count counter 30 can be used to determine the value of Iinternal, which, when Vinternal is decoupled from Vdd2 and the clocks provided to circuit under test 14 are frozen, represents the quiescent current (Iddq) of circuit under test 14. Therefore, "Iinternal=Iddq=(counter value of counter 32/counter value of counter 30)*Iref." Also, note that the resolution of Iddq is a function of the clock cycles of TCLK.

In one embodiment, measurement circuit 12 is used in combination with scan circuitry available on circuit under test 14. Note that the scan circuitry and operation of the scan circuitry in test modes within circuit under test 14 are known in the art and will not be described in further detail herein. Operation of measurement circuit 12 will be described in more detail in reference to the flow diagram of FIG. 2. Note that, as will be described further below, the flow diagram of FIG. 2 also applies to the measurement circuits of FIGS. 3 and 4.

Figure 2:
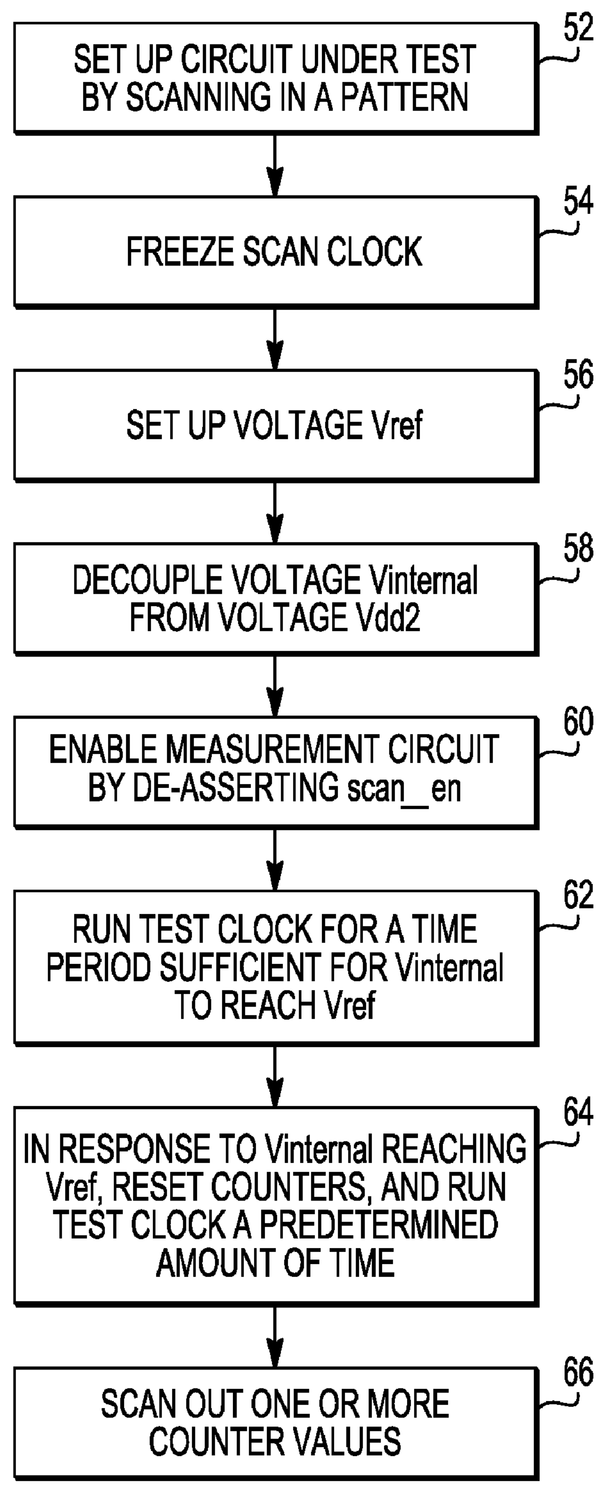
FIG. 2 illustrates, in flow diagram form, a method for measuring quiescent circuit in the circuit under test, in accordance with one embodiment of the present invention.

FIG. 2 illustrates, in flow diagram form, a method 50 for performing an Iddq measurement in accordance with one embodiment. Method 50 begins with block 52 in which circuit under test 14 is set up by scanning in a test pattern. For example, in one embodiment, this includes asserting a scan enable signal, scan_en, in a test mode which configures the scan chains within circuit under test 14 to receive scanned in test data. With scan_en asserted, a test pattern can be scanned into the scan chains of circuit under test 14 via a scan input, scan data in, of circuit under test 14. The test pattern is scanned in according to a scan clock such that for each pulse of the scan clock, another bit of each scan chain is received. Flow then proceeds to block 54 where the scan clocks are frozen.

Still referring to FIG. 2, flow proceeds from block 54 to block 56 where the reference voltage, Vref, is set up to a known reference value. In one embodiment, the value of Vref is set to the desired average value for Vinternal during testing. For example, in one embodiment, this is a voltage that can be provided from an external source to circuit 10. Alternatively, it can be generated from one or more sources on a same IC as measurement circuit 12 or circuit 10 or from within circuit under test 14. Further examples of how to set up Vref to a known reference value will be described in reference to FIGS. 3 and 4 below. Flow then proceeds to block 58 where Vinternal is decoupled from Vdd2. For example, referring back to FIG. 1, this may include opening switch S1 to decouple Vinternal from Vdd2. In alternate embodiments, in which voltage regulators are used, different methods may be used to decouple Vinternal from Vdd2 (or from whichever voltage supply is supplying its operating voltage). Further examples will be described with respect to FIGS. 3 and 4. Note also, that depending on the embodiment, the operations of method 50, such as blocks 54, 56, and 58, can be performed in different orders, as needed. Also, the operations may be combined or expanded as needed.

Flow then proceeds from block 58 to block 60 in which measurement circuit 12 is enabled. In one embodiment, measurement circuit 12 is enabled in response to the deassertion of scan_en, when in test mode. Therefore, in one embodiment, control circuitry 28 enables comparator 16, in response to the deassertion of scan_en (when circuit 10 is operating in test mode). Flow then proceeds to block 62 where the test clock (TCLK) is run for a time period sufficient for Vinternal to reach Vref. For example, comparator 16 and transistor 22 attempt to maintain Vinternal at or near the value of Vref. However, initially (when TCLK is started), Vref may either be greater than Vinternal or less than Vinternal, depending on the embodiment. Control circuitry 28 can therefore monitor the output of DFF 18 such that the first time, since comparator 16 is enabled, it sees Q transition from a logic level 0 to a logic level 1, it can reset counters 30 and 32 to start counting. That is, control circuitry 28 may wait for a first rising edge in Q to determine that Vinternal is sufficiently at the level of Vref.

For example, referring to FIG. 1, when Vinternal is decoupled from Vdd2, and Vref is initially greater than Vinternal, the output of comparator 16 is a logic level 1, thus causing transistor 22 to be on. When transistor 22 is on, Iref is provided to circuit under test 14. As Iref is provided, Vinternal increases until a point at which it becomes greater than the value of Vref, at which point, the output of comparator 16 becomes a logic level 0, thus turning off Iref. However, Q has not yet had a first rising edge (from a logic level 0 to 1). With Iref off, Vinternal decreases until a point at which it becomes less than the value of Vref, at which point, the output of comparator 16 becomes a logic level 1, thus again turning on Iref. At this point, control circuitry 28 detects a first rising edge in Q since TCLK was enabled and thus may determine that a sufficient amount of time has passed to ensure that Vinternal is being maintained at or near the value of Vref by comparator 16 and transistor 22.

In another example, referring to FIG. 1, when Vinternal is decoupled from Vdd2 and Vref is initially less than Vinternal, the output of comparator 16 is a logic level 0, thus causing transistor 22 to be off. When transistor 22 is off, Iref is not provided to circuit under test 14 and thus Vinternal decreases until a point at which it becomes less than the value of Vref, at which point, the output of comparator 16 becomes a logic level 1, thus turning on Iref. At this point, control circuitry 28 detects a first rising edge in Q since TCLK was enabled and thus may determine that a sufficient amount of time has passed to ensure that Vinternal is being maintained at or near the value of Vref by comparator 16 and transistor 22.

Therefore, depending on whether Vinternal is initially greater than or less than Vref, the amount of time that control circuitry 28 may deem as sufficient for Vinternal to reach Vref may differ. Also, in the above embodiment, control circuitry 28 determines this time period to be sufficient when it detects a first rising edge in Q since TCLK is enabled. However, alternatively, other methods may be used and other circuit points may be monitored to determine when Vinternal is being sufficiently maintained at or near the value of Vref.

Referring back to FIG. 2, flow proceeds to block 64 where, in response to Vinternal reaching Vref (i.e. in response to Vinternal being sufficiently maintained at or near the value of Vref), counters 30 and 32 are reset and the test clock (TCLK) is run for a predetermined amount of time during which counters 30 and 32 are counting, where counter 30 counts pulses of TCLK during the predetermined amount of time and counter 32 counts the number of pulses of TCLK during which Q is at a logic level 1 (i.e. during which transistor 22 is on and thus Iref is being provided to circuit under test 14). The predetermined amount of time may be set to any value, depending on the desired resolution of the measurement. After the predetermined amount of time, the counter values of counters 30 and 32 can be provided to a scan chain of circuit under test 14 (such as via conductors 34 and 36, respectively) so that they can be scanned out via a scan data output, scan data out. In one embodiment, the predetermined amount of time is determined by counter 30. For example, in one embodiment, the predetermined amount of time begins with counter 30 being reset and ends when counter 30 overflows. Therefore, control circuitry 28 may monitor when counter 30 overflows to determine that the predetermined amount of time has ended. In this embodiment, only the counter value of counter 32 may need to be provided to circuit under test for output. In another embodiment, the counter values of the counters may be provided back to control circuitry 28 which may process the values prior to providing them to a scan chain of circuit under test 14. In yet another embodiment, the counter values or a processed value from control circuitry 28 may be directly output from measurement circuitry 12 via a circuit terminal.

Referring back to FIG. 2, flow then proceeds to block 66 where the one or more counter values may be scanned out from circuit under test 14. For example, in one embodiment, the one or more counter values may be scanned out on scan data out by asserting scan_en and unfreezing the scan clock.

Figure 3:
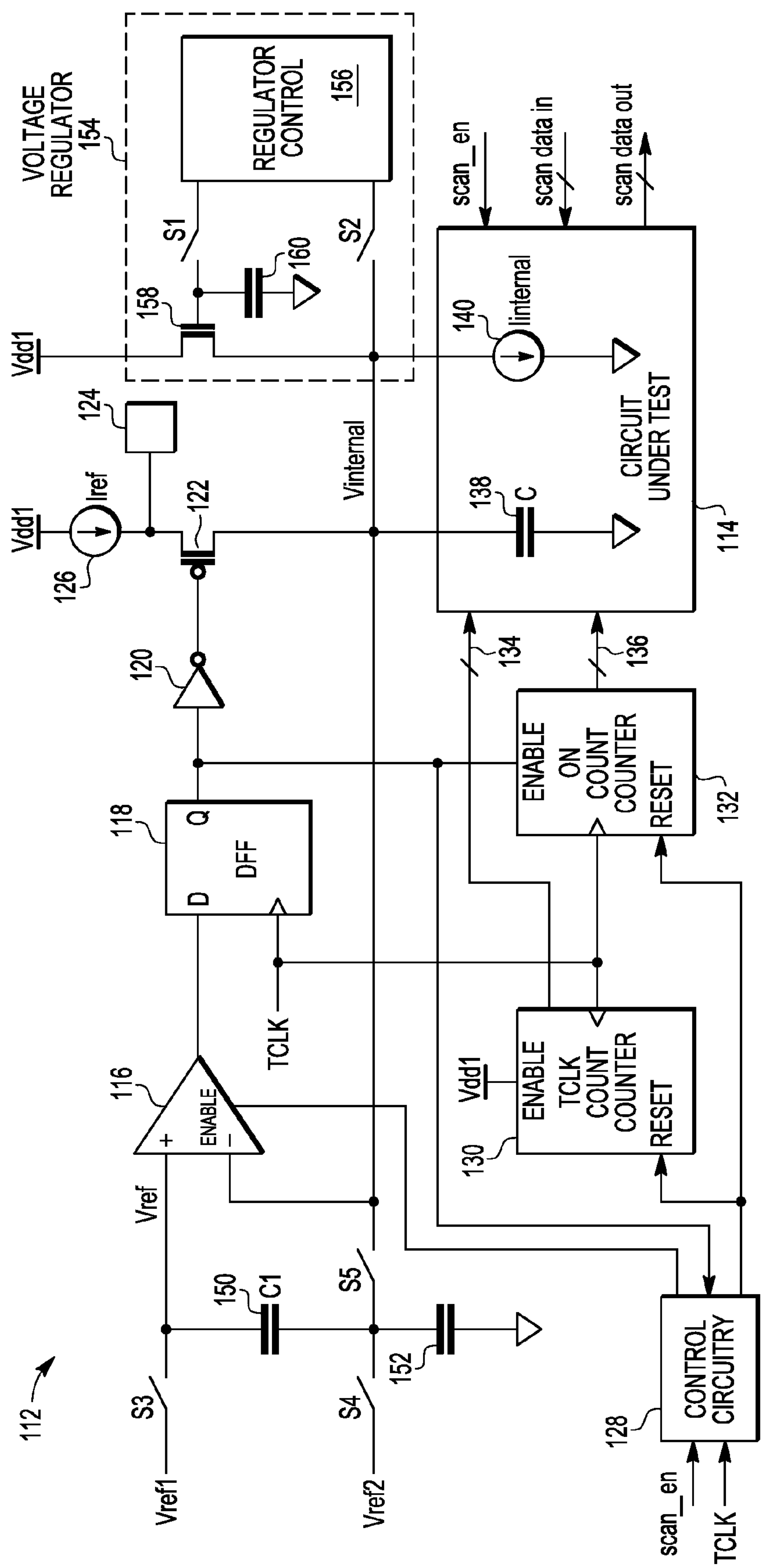
FIG. 3 illustrates, in partial schematic and partial block diagram form, a measurement circuit coupled to a circuit under test with an N-type metal oxide semiconductor (NMOS) voltage regulator, in accordance with one embodiment of the present invention.

FIG. 3 illustrates, in partial schematic form and partial block diagram form, a circuit 110 which includes a measurement circuit 112, a voltage regulator 154, and a circuit under test 114. Measurement circuit 112 includes a comparator 116, a D flip flop (DFF) 118, an inverter 120, a current source 126, a PMOS transistor 122, control circuitry 128, a TCLK count counter 130, an on count counter 132, a capacitive element C1 150, and a capacitive element 152. A positive input of comparator 116 receives a reference voltage, Vref, and a negative input of comparator 116 is coupled to a circuit node, Vinternal. A first reference voltage, Vref1, is coupled to a first terminal of a switch S3, and a second terminal of switch S3 is coupled to the positive input of comparator 116 and to a first plate electrode of capacitive element 150. A second reference voltage, Vref2, is coupled to a first terminal of a switch S4, and a second terminal of a switch S4 is coupled to a second plate electrode of capacitive element 150, a first terminal of a switch S5, and a first plate electrode of capacitive element 152. A second plate electrode of capacitive element 153 is coupled to Vss (also referred to as ground or another power supply). A second terminal of switch S5 is coupled to Vinternal. The output of comparator 116 is coupled to a data input, D, of DFF 118. Control circuitry 128 provides an enable signal to an enable input of comparator 116. A test clock (TCLK) is provided to the clock inputs of DFF 118 and counters 130 and 132 and to control circuitry 128. A data output, Q, of DFF 118 is coupled to an input of inverter 120 and to an enable input of on count counter 132, and is also provided to control circuitry 128. An output of inverter 120 is coupled to a control electrode of transistor 122. An enable input of TCLK count counter 130 is coupled to a first power supply, Vdd1. Control circuitry 128 provides a reset signal to reset inputs of counters 130 and 132. Control circuitry 128 also receives a scan enable signal, scan_en. Data outputs of each of counters 130 and 132 are provided to circuit under test 114 via conductors 134 and 136, respectively. A first terminal of current source 126 is coupled to Vdd1 and a second terminal of current source 126 is coupled to a first current electrode of transistor 122. A second current electrode of transistor 122 is coupled to Vinternal.

Voltage regulator 154 includes an NMOS transistor 158, a capacitive element 160 and a regulator control 156. A first current electrode of transistor 158 is coupled to Vdd1, a second current electrode of transistor 158 is coupled to Vinternal, and a control electrode of transistor 158 is coupled to a first plate electrode of capacitive element 160 and to a first terminal of switch S1. A second plate electrode of capacitive element 160 is coupled to Vss. Regulator control 156 is coupled to a second terminal of switch S1 and a first terminal of switch S2. A second terminal of switch S2 is coupled to Vinternal. Note that voltage regulator 154 may operate as known in the art (when switches S1 and S2 are closed, thus forming a feedback loop).

Circuit under test 114 can be any circuit being tested such as, for example, a processor, a portion of a processor, a processor core, a memory, a plurality of logic gates, etc. In one embodiment, circuit under test 114 is digital circuitry. Circuit under test 114 is represented by a capacitive element 138 which represents the load or cumulative capacitance of circuit under test 114 and a current source 140 which represents the internal current of circuit under test 114. Capacitive element 138 has a first plate electrode which is coupled to Vinternal and a second plate electrode which is coupled to Vss. Current source 140 has a first terminal coupled to Vinternal and a second terminal coupled to Vss. Circuit under test 114 also receives scan_en and scan data in, and provides scan data out. In one embodiment, each element of measurement circuit 112 is powered by Vdd1.

In one embodiment, circuit 110 is implemented on a single integrated circuit. Alternatively, circuit 110 can be implemented using one or more integrated circuits. In one embodiment, portions of circuit 110 may be located external to the remaining portions of circuit 110. For example, counter 130 may be located external to circuit 110 (i.e. off-chip), such as, for example, within an external tester.

In operation, FIG. 3 operates similar to FIG. 1, except that voltage regulator 154 is used to regulate Vinternal rather than coupling or decoupling Vdd2 directly to or from Vinternal. Also, FIG. 3 provides one example of circuitry which may be used to set Vref to a known value. Therefore, operation of comparator 116, DFF 118, inverter 120, transistor 122, current source 126, counters 130 and 132, and circuit under test 114 operate analogous to comparator 16, DFF 18, inverter 20, transistor 22, current source 26, counters 30 and 32, and circuit under test 14, where the descriptions provided above in reference to FIGS. 1 and 2 for these elements also apply to FIG. 3. Control circuitry 128 also operates analogous to control circuitry 28, but may include additional circuitry to control switches S1-S5 as needed.

Referring back to FIG. 2, Vref is set up in block 56 and Vinternal is decoupled from Vdd2 in block 58. In the embodiment of FIG. 3, this may done through the control of switches S1-S5. During normal operation, switches S1 and S2 are closed and switches S3-S5 are open. Therefore, for setting up Vref and decoupling Vinternal, first switches S3 and S4 are closed while switch S5 remains open and switches S1 and S2 remain closed. In this manner, capacitive element 150 is charged to the voltage Vref1−Vref2. In one embodiment, Vref1 and Vref2 are provided from within circuit 110, such as from within voltage regulator 154. For example, these may be provided by an on-chip bandgap reference. After capacitive element 150 charges to Vref1−Vref2, switches S3 and S4 are opened and switch S5 is closed to couple the second plate electrode of capacitive element 150 to Vinternal. Therefore, Vref becomes "Vinternal+(Vref1−Vref2)" which is the value of the reference voltage, Vref, used when measuring Iddq in this embodiment. Next, the gate voltage of transistor 158 is frozen and the feedback of voltage regulator 154 is disconnected by opening switches S1 and S2. Also, switch S5 is opened to decouple Vinternal from capacitive element 150 since Vref has already been set to the desired value. At this point, measurement circuit 112 can be enabled to measure Iddq, as was described above with respect to measurement circuit 12 in reference to FIGS. 1 and 2.

In the embodiment of FIG. 3, once TCLK begins running, Vinternal is initially less than Vref. Therefore, as described above with respect to block 62 of FIG. 2, once TCLK begins running, Vinternal begins to increase to reach the value of Vref (due to the output of comparator 116 being a logic level 1 and thus transistor 122 being on to provide Iref to circuit under test 114). With respect to FIG. 3, when Vinternal reaches Vref, note that voltage regulator 154 becomes pinched off, thus effectively decoupling Vdd1 from circuit under test 114. That is, at this point, driver transistor 158 is prevented from affecting Vinternal. Therefore, in the embodiment of FIG. 1, the Vref operating voltage of circuit under test 14 is decoupled by switch S1, while in the embodiment of FIG. 3, the Vref operating voltage of circuit under test 114 is elevated above the original Vinternal and decoupled by pinching off voltage regulator 154. Also, as was described above, control circuitry 128 can monitor the output of DFF 118 to determine when this output has a first rising edge after starting TCLK to determine when to reset counters 130 and 132. (Note that since, in this example, Vinternal is initially less than Vref and thus Q is initially a logic level 1, control circuitry 128 waits for Q to become a logic level 0 and then become a logic level 1 again before resetting counters 130 and 132.)

Figure 4:
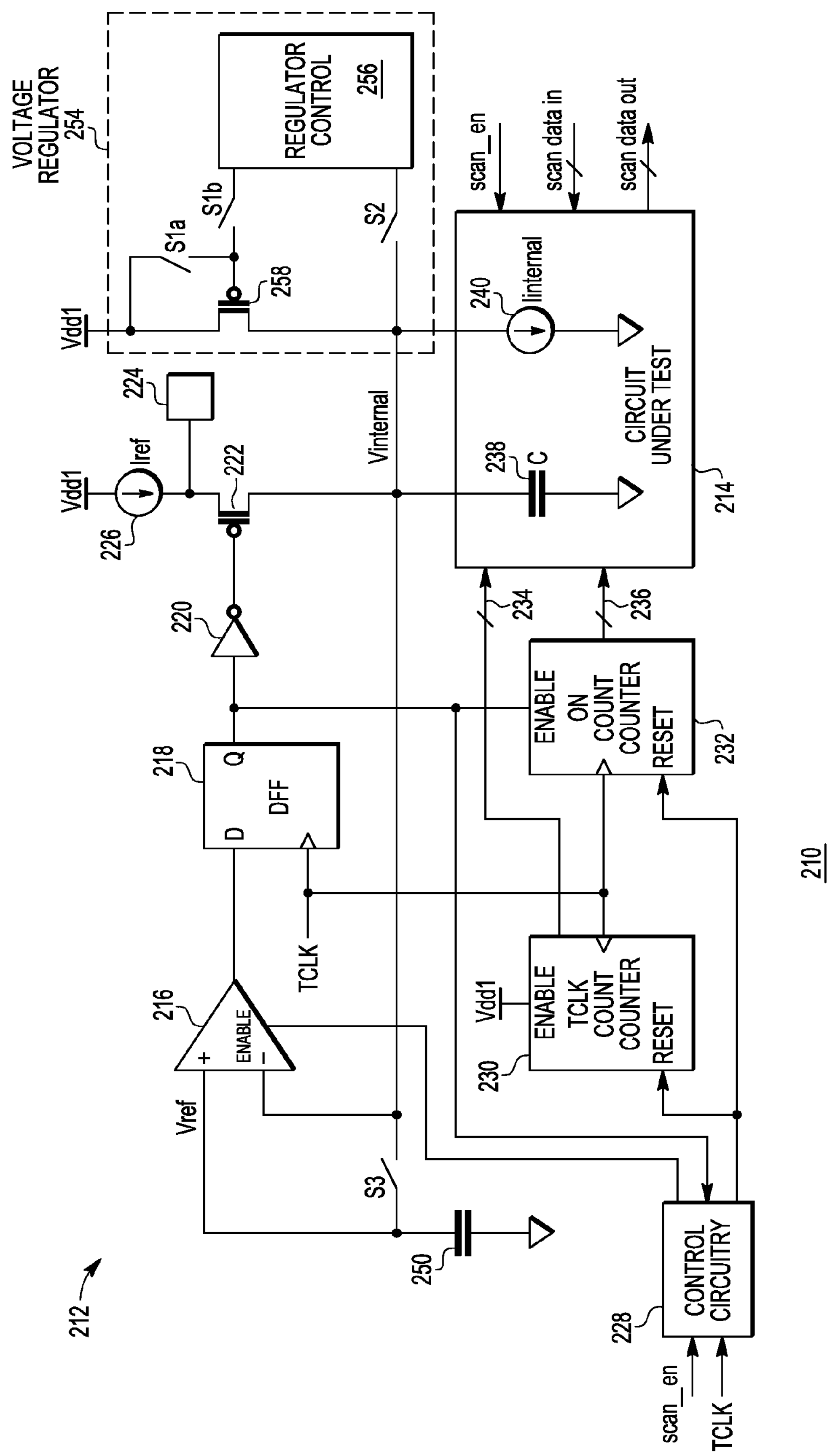
FIG. 4 illustrates, in partial schematic and partial block diagram form, a measurement circuit coupled to a circuit under test with a P-type metal oxide semiconductor (PMOS) voltage regular, in accordance with one embodiment of the present invention.

FIG. 4 illustrates, in partial schematic form and partial block diagram form, a circuit 210 which includes a measurement circuit 212, a voltage regulator 254, and a circuit under test 214. Measurement circuit 212 includes a comparator 216, a D flip flop (DFF) 218, an inverter 220, a current source 226, a PMOS transistor 222, control circuitry 228, a TCLK count counter 230, an on count counter 232, and a capacitive element 250. A positive input of comparator 216 receives a reference voltage, Vref, and a negative input of comparator 216 is coupled to a circuit node, Vinternal. A first plate electrode of capacitive element 250 is coupled to the positive input of comparator 216 and to a first terminal of a switch S3. A second plate electrode of capacitive element 250 is coupled to Vss (also referred to as ground or another power supply). A second terminal of switch S3 is coupled to Vinternal. The output of comparator 216 is coupled to a data input, D, of DFF 218. Control circuitry 228 provides an enable signal to an enable input of comparator 216. A test clock (TCLK) is provided to the clock inputs of DFF 218 and counters 230 and 232 and to control circuitry 228. A data output, Q, of DFF 218 is coupled to an input of inverter 220 and to an enable input of on count counter 232, and is also provided to control circuitry 228. An output of inverter 220 is coupled to a control electrode of transistor 222. An enable input of TCLK count counter 230 is coupled to a first power supply, Vdd1. Control circuitry 228 provides a reset signal to reset inputs of counters 230 and 232. Control circuitry 228 also receives a scan enable signal, scan_en. Data outputs of each of counters 230 and 232 are provided to circuit under test 214 via conductors 234 and 236, respectively. A first terminal of current source 226 is coupled to Vdd1 and a second terminal of current source 226 is coupled to a first current electrode of transistor 222. A second current electrode of transistor 222 is coupled to Vinternal.

Voltage regulator 254 includes a PMOS transistor 258 and a regulator control 256. A first current electrode of transistor 258 is coupled to Vdd1 and to a first terminal of a switch S1*a*, a second current electrode of transistor 258 is coupled to Vinternal, and a control electrode of transistor 258 is coupled to a second terminal of switch S1*a* and to a first terminal of a switch S1*b*. Regulator control 256 is coupled to a second terminal of switch S1*b* and a first terminal of switch S2. A second terminal of switch S2 is coupled to Vinternal. Note that voltage regulator 254 may operate as known in the art (when switch S1*a* is open, and switches S1*b* and S2 are closed, thus forming a feedback loop).

Circuit under test 214 can be any circuit being tested such as, for example, a processor, a portion of a processor, a processor core, a memory, a plurality of logic gates, etc. In one embodiment, circuit under test 214 is digital circuitry. Circuit under test 214 is represented by a capacitive element 238 which represents the load or cumulative capacitance of circuit under test 214 and a current source 240 which represents the internal current of circuit under test 214. Capacitive element 238 has a first plate electrode which is coupled to Vinternal and a second plate electrode which is coupled to Vss. Current source 240 has a first terminal coupled to Vinternal and a second terminal coupled to Vss. Circuit under test 214 also receives scan_en and scan data in, and provides scan data out. In one embodiment, each element of measurement circuit 212 is powered by Vdd1.

In one embodiment, circuit 210 is implemented on a single integrated circuit. Alternatively, circuit 210 can be implemented using one or more integrated circuits. In one embodiment, portions of circuit 210 may be located external to the remaining portions of circuit 210. For example, counter 230 may be located external to circuit 210 (i.e. off-chip), such as, for example, within an external tester.

In operation, FIG. 4 also operates similar to FIG. 1, except that voltage regulator 254 is used to regulate Vinternal rather than coupling or decoupling Vdd2 directly to or from Vinternal. Also, FIG. 4 provides one example of circuitry which may be used to set Vref to a known value. Therefore, operation of comparator 216, DFF 218, inverter 220, transistor 222, current source 226, counters 230 and 232, and circuit under test 214 operate analogous to comparator 16, DFF 18, inverter 20, transistor 22, current source 26, counters 30 and 32, and circuit under test 14, where the descriptions provided above in reference to FIGS. 1 and 2 for these elements also apply to FIG. 4. Control circuitry 228 also operates analogous to control circuitry 28, but may include additional circuitry to control switches S1*a*, S1*b*, S2, and S3 as needed.

Referring back to FIG. 2, Vref is set up in block 56 and Vinternal is decoupled from Vdd2 in block 58. In the embodiment of FIG. 4, this may done through the control of switches S1*a*, S1*b*, S2, and S3. During normal operation, switches S1*a* and S3 are open, switches S1*b* and S2 are closed. Therefore, for setting up Vref and decoupling Vinternal, first switch S3 is closed. In this manner, capacitive element 250 is charged to Vinternal (prior to measuring) such that Vref=Vinternal. After capacitive element 250 charges to Vinternal, switch S3 is opened. Next, the gate voltage of transistor 258 is forced to equal its source voltage and the feedback of voltage regulator 254 is disconnected by closing switch S1*a* and opening switches S1*b* and S2. At this point, measurement circuit 212 can be enabled to measure Iddq, as was described above with respect to measurement circuit 12 in reference to FIGS. 1 and 2.

In one embodiment of FIG. 4, once TCLK begins running, Vinternal is initially smaller than Vref if, for example, the enabling of measurement circuit 212 is delayed from the disabling of voltage regulator 254 and there is some leakage discharge on Vinternal. Therefore, in this example, as described above with respect to block 62 of FIG. 2, once TCLK begins running, Vinternal begins to increase to reach the value of Vref (due to the output of comparator 216 being a logic level 1 and thus transistor 222 being on and providing Iref to circuit under test 214). Since the driver transistor 258 of voltage regulator 254 is disabled, it does not affect Vinternal during the measurement of Iddq. As also described above, control circuitry 228 can monitor the output of DFF 218 to determine when this output first goes high after starting TCLK to determine when to reset counters 230 and 232.

In another embodiment of FIG. 4, once TCLK begins running, Vinternal is equal to Vref if, for example, both measurement circuit 212 is enabled and voltage regulator 254 is disabled simultaneously. In this example, the output of comparator 216 is unknown. Therefore, control circuitry 228 can monitor the output of DFF 218 to use the second rising edge after starting TCLK to determine when to reset counters 230 and 232.

In yet another embodiment of FIG. 4, one TCLK begins running, Vinternal is equal to Vref if, for example, both measurement circuit 212 is enabled and voltage regulator 254 is disabled simultaneously. Again, in this example, the output of comparator 216 is unknown. In this example, though, control circuitry 228 can monitor the output of DFF 218 to use the first rising edge after starting TCLK to determine when to reset counters 230 and 232. In this example, it may be assumed that the error from equilibration is negligible.

In the embodiment of FIG. 1 described above, the value of Iref may be used in combination with the outputs of counters 30 and 32 to calculated Iddq. In one embodiment, Iref may be externally measured for increased accuracy, such as via circuit terminal 24. Similarly, Iref may be externally measured in each of the embodiments of FIGS. 3 and 4 as well, such as via circuit terminal 124 or 224, respectively. Also, note that each of DFF 18, 118, and 218 may be referred to as a latch.

Also, note that each of transistors 22, 122, and 222 may be referred to as a switch, where the control electrode of each of these switches may be referred to as the control terminal of the switch. Note that each of the voltage supplies, such as Vdd1, Vdd2, and Vss, may be provided or coupled to corresponding circuit elements via corresponding voltage supply or ground terminals.

By now it should be appreciated that there has been provided a measurement circuit which may accurately measure the quiescent current of a circuit under test and which may also be fully or partially located on-chip (on a same IC) with the circuit under test. In one embodiment, one or more counters provide an n-bit digital value which may be used to determine this quiescent current. That is, one or more counters may be used for providing one or more counter values associated with this quiescent current. In one embodiment, a ratio of two counter values (such as, for example, the ratio of the counter value of on count counter 30 to TCLK count counter 32) is proportional to this quiescent current. Furthermore, in one embodiment, the measurement circuit may be used in combination with the scan circuitry of the circuit under test to, for example, enable the measurement circuit and to provide an output external to the IC that is representative of the measured quiescent current, such as the n-bit digital value.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms “front,” “back,” “top,” “bottom,” “over,” “under” and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Some of the above embodiments, as applicable, may be implemented using a variety of different circuit elements. Those skilled in the art will recognize that the boundaries between logic blocks or circuit elements are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. Likewise, any two components so associated can also be viewed as being “operably connected,” or “operably coupled,” to each other to achieve the desired functionality.

Also for example, in one embodiment, the illustrated elements of each of circuit 10, 110, or 210 are circuitry located on a single integrated circuit or within a same device. Alternatively, each of circuits 10, 110, and 210 may include any number of separate integrated circuits or separate devices interconnected with each other.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, various different methods and circuit elements may be used to provide Vref or Iref or may be used to effectively decouple Vinternal from its power source. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless indicated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a measurement circuit for measuring a quiescent current of a circuit under test. The measurement circuit includes a comparator having a first input terminal for receiving a reference voltage, a second input terminal coupled to the circuit under test, and an output terminal; a current source having a first terminal coupled to a first power supply voltage terminal, and a second terminal for providing a current to the circuit under test; a first switch having a first terminal coupled to the second terminal of the current source, a second terminal coupled to the circuit under test, and a control terminal coupled to the output terminal of the comparator; and a first counter having a first input terminal coupled to the output terminal of the comparator, a second input terminal for receiving a clock signal, and an output terminal for providing a first counter value associated with the quiescent current. Item 2 includes the measurement circuit of item 1 and further includes a second counter having a first input coupled to the first power supply voltage terminal, a second input for receiving the clock signal, and an output for providing a second counter value, wherein an amount of quiescent current is proportional to a ratio of the first counter value to the second counter value. Item 3 includes the measurement circuit of item 1 wherein the measurement circuit and the circuit under test are implemented on a single integrated circuit. Item 4 includes the measurement circuit of item 1 and further includes a latch having a first input coupled to the output terminal of the comparator, a second input for receiving the clock signal, and an output coupled to the control terminal of the first switch. Item 5 includes the measurement circuit of item 4 wherein the latch is further characterized as being a D-type flip-flop. Item 6 includes the measurement circuit of item 1 and further includes a voltage regulator for providing a second power supply voltage to the circuit under test. Item 7 includes the measurement circuit of item 1 and further includes a first capacitive element having a first plate electrode coupled to the first input terminal of the comparator, and a second plate electrode; a second switch having a first terminal for receiving a first voltage, and a second terminal coupled to the first input terminal of the comparator; a second capacitive element having a first plate electrode coupled to the second plate electrode of the first capacitive element, and a second plate electrode coupled to a ground terminal; a third switch having a first terminal for receiving a second voltage, and a second terminal coupled to the second plate electrode of the first capacitive element; and a fourth switch having a first terminal coupled to the second plate electrode of the first capacitive element, and a second terminal coupled to the circuit under test. Item 8 includes the measurement circuit of item 1 wherein the first counter value is scanned out using a scan chain of the circuit under test. Item 9 includes the measurement circuit of item 1 and further includes a first capacitive element having a first plate electrode coupled to the first input terminal of the comparator, and a second plate electrode coupled to a ground terminal; and a second switch having a first terminal coupled to the first plate electrode of the first capacitive element, and a second terminal coupled to the circuit under test. Item 10 includes the measurement circuit of item 1 wherein the circuit under test is characterized as being digital circuitry.

Item 11 includes a measurement circuit for measuring a quiescent current of a circuit under test. The measurement circuit includes a comparator having a first input terminal for receiving a reference voltage, a second input terminal coupled to the circuit under test, and an output terminal; a current source having a first terminal coupled to a first power supply voltage terminal, and a second terminal for providing a current to the circuit under test; a first transistor having a first terminal coupled to the second terminal of the current source, a second terminal coupled to the circuit under test, and a control terminal coupled to the output terminal of the comparator; a voltage regulator having an input terminal coupled to the first power supply voltage terminal, and an output terminal coupled to the circuit under test; a first counter having a first input terminal coupled to the output terminal of the comparator, a second input terminal for receiving a clock signal, and an output terminal for providing a first counter value; and a second counter having a first input coupled to the first power supply voltage terminal, a second input for receiving the clock signal, and an output for providing a second counter value, wherein an amount of quiescent current is proportional to a ratio of the first counter value to the second counter value. Item 12 includes the measurement circuit of item 11 wherein the measurement circuit and the circuit under test are implemented on a single integrated circuit, and wherein the circuit under test is further characterized as being digital circuitry. Item 13 includes the measurement circuit of item 11 and further includes a flip-flop having a first input coupled to the output terminal of the comparator, a second input for receiving the clock signal, and an output coupled to the control terminal of the first transistor. Item 14 includes the measurement circuit of item 11 and further includes a first capacitive element having a first plate electrode coupled to the first input terminal of the comparator, and a second plate electrode; a second switch having a first terminal for receiving a first voltage, and a second terminal coupled to the first input terminal of the comparator; a second capacitive element having a first plate electrode coupled to the second plate electrode of the first capacitive element, and a second plate electrode coupled to a ground terminal; a third switch having a first terminal for receiving a second voltage, and a second terminal coupled to the second plate electrode of the first capacitive element; and a fourth switch having a first terminal coupled to the second plate electrode of the first capacitive element, and a second terminal coupled to the circuit under test. Item 15 includes the measurement circuit of item 11 wherein the first counter value is scanned out using a scan chain of the circuit under test. Item 16 includes the measurement circuit of item 11 and further includes a first capacitive element having a first plate electrode coupled to the first input terminal of the comparator, and a second plate electrode coupled to a ground terminal; and a second switch having a first terminal coupled to the first plate electrode of the first capacitive element, and a second terminal coupled to the circuit under test.

Item 17 includes a method for measuring a quiescent current of a circuit under test. The method includes providing a measurement circuit having a counter, the counter for providing a counter value; coupling a test clock to the counter; providing a supply voltage to the circuit under test; providing a test pattern to the circuit under test, the test pattern for setting the circuit under test in a known state; decoupling the supply voltage from the circuit under test; running the test clock for a time period sufficient for an internal voltage of the circuit under test to reach a predetermined voltage level; resetting the counter to an initial counter value; running the test clock for a predetermined amount of time; comparing the internal voltage to the predetermined voltage level, and if the internal voltage is lower than the predetermined voltage level, providing a reference current to the circuit under test to charge the internal voltage to the predetermined voltage level; and providing a counter value representative of the quiescent current of the circuit under test. Item 18 include the method of item 17 wherein providing a counter value further includes scanning out the counter value using a scan chain of the circuit under test. Item 19 includes the method of item 17 wherein the supply voltage is further characterized as being a regulated supply voltage. Item 20 includes the method of item 17 wherein the measurement circuit and the circuit under test are implemented on a same integrated circuit.

What is claimed is:

1. A measurement circuit for measuring a quiescent current of a circuit under test, the measurement circuit comprising:

a comparator having a first input terminal for receiving a reference voltage, a second input terminal coupled to the circuit under test, and an output terminal;

a current source having a first terminal coupled to a first power supply voltage terminal, and a second terminal for providing a current to the circuit under test;

a first switch having a first terminal coupled to the second terminal of the current source, a second terminal coupled to the circuit under test, and a control terminal coupled to the output terminal of the comparator;

a first counter having a first input terminal coupled to the output terminal of the comparator, a second input terminal for receiving a clock signal, and an output terminal for providing a first counter value associated with the quiescent current; and a second counter having a first input coupled to the first power supply voltage terminal, a second input for receiving the clock signal, and an output for providing a second counter value, wherein an amount of quiescent current is proportional to a ratio of the first counter value to the second counter value.

2. The measurement circuit of claim 1, wherein the measurement circuit and the circuit under test are implemented on a single integrated circuit.

3. The measurement circuit of claim 1, wherein the first counter value is scanned out using a scan chain of the circuit under test.

4. The measurement circuit of claim 1, further comprising:

a first capacitive element having a first plate electrode coupled to the first input terminal of the comparator, and a second plate electrode coupled to a ground terminal; and a second switch having a first terminal coupled to the first plate electrode of the first capacitive element, and a second terminal coupled to the circuit under test.

5. The measurement circuit of claim 1, wherein the circuit under test is characterized as being digital circuitry.

6. A measurement circuit for measuring a quiescent current of a circuit under test, the measurement circuit comprising:

a comparator having a first input terminal for receiving a reference voltage, a second input terminal coupled to the circuit under test, and an output terminal;

a current source having a first terminal coupled to a first power supply voltage terminal, and a second terminal for providing a current to the circuit under test;

a first switch having a first terminal coupled to the second terminal of the current source, a second terminal coupled to the circuit under test, and a control terminal coupled to the output terminal of the comparator;

a first counter having a first input terminal coupled to the output terminal of the comparator, a second input terminal for receiving a clock signal, and an output terminal for providing a first counter value associated with the quiescent current; and a latch having a first input coupled to the output terminal of the comparator, a second input for receiving the clock signal, and an output coupled to the control terminal of the first switch.

7. The measurement circuit of claim 6, wherein the latch is further characterized as being a D-type flip-flop.

8. The measurement circuit of claim 6, wherein the measurement circuit and the circuit under test are implemented on a single integrated circuit.

9. The measurement circuit of claim 6, further comprising:

a first capacitive element having a first plate electrode coupled to the first input terminal of the comparator, and a second plate electrode coupled to a ground terminal; and a second switch having a first terminal coupled to the first plate electrode of the first capacitive element, and a second terminal coupled to the circuit under test.

10. The measurement circuit of claim 6, wherein the first counter value is scanned out using a scan chain of the circuit under test.

11. A measurement circuit for measuring a quiescent current of a circuit under test, the measurement circuit comprising:

a comparator having a first input terminal for receiving a reference voltage, a second input terminal coupled to the circuit under test, and an output terminal;

a current source having a first terminal coupled to a first power supply voltage terminal, and a second terminal for providing a current to the circuit under test;

a first switch having a first terminal coupled to the second terminal of the current source, a second terminal coupled to the circuit under test, and a control terminal coupled to the output terminal of the comparator;

a first counter having a first input terminal coupled to the output terminal of the comparator, a second input terminal for receiving a clock signal, and an output terminal for providing a first counter value associated with the quiescent current; and a voltage regulator for providing a second power supply voltage to the circuit under test.

12. The measurement circuit of claim 11, wherein the measurement circuit and the circuit under test are implemented on a single integrated circuit.

13. The measurement circuit of claim 11, further comprising:

a first capacitive element having a first plate electrode coupled to the first input terminal of the comparator, and a second plate electrode coupled to a ground terminal; and a second switch having a first terminal coupled to the first plate electrode of the first capacitive element, and a second terminal coupled to the circuit under test.

14. A measurement circuit for measuring a quiescent current of a circuit under test, the measurement circuit comprising:

a comparator having a first input terminal for receiving a reference voltage, a second input terminal coupled to the circuit under test, and an output terminal;

a current source having a first terminal coupled to a first power supply voltage terminal, and a second terminal for providing a current to the circuit under test;

a first switch having a first terminal coupled to the second terminal of the current source, a second terminal coupled to the circuit under test, and a control terminal coupled to the output terminal of the comparator;

a first counter having a first input terminal coupled to the output terminal of the comparator, a second input terminal for receiving a clock signal, and an output terminal for providing a first counter value associated with the quiescent current;

a first capacitive element having a first plate electrode coupled to the first input terminal of the comparator, and a second plate electrode;

a second switch having a first terminal for receiving a first voltage, and a second terminal coupled to the first input terminal of the comparator;

a second capacitive element having a first plate electrode coupled to the second plate electrode of the first capacitive element, and a second plate electrode coupled to a ground terminal;

a third switch having a first terminal for receiving a second voltage, and a second terminal coupled to the second plate electrode of the first capacitive element; and a fourth switch having a first terminal coupled to the second plate electrode of the first capacitive element, and a second terminal coupled to the circuit under test.

15. A measurement circuit for measuring a quiescent current of a circuit under test, the measurement circuit comprising:

a comparator having a first input terminal for receiving a reference voltage, a second input terminal coupled to the circuit under test, and an output terminal;

a current source having a first terminal coupled to a first power supply voltage terminal, and a second terminal for providing a current to the circuit under test;

a first transistor having a first terminal coupled to the second terminal of the current source, a second terminal coupled to the circuit under test, and a control terminal coupled to the output terminal of the comparator;

a voltage regulator having an input terminal coupled to the first power supply voltage terminal, and an output terminal coupled to the circuit under test;

a first counter having a first input terminal coupled to the output terminal of the comparator, a second input terminal for receiving a clock signal, and an output terminal for providing a first counter value; and a second counter having a first input coupled to the first power supply voltage terminal, a second input for receiving the clock signal, and an output for providing a second counter value, wherein an amount of quiescent current is proportional to a ratio of the first counter value to the second counter value.

16. The measurement circuit of claim 15, wherein the measurement circuit and the circuit under test are implemented on a single integrated circuit, and wherein the circuit under test is further characterized as being digital circuitry.

17. The measurement circuit of claim 15, further comprising a flip-flop having a first input coupled to the output terminal of the comparator, a second input for receiving the clock signal, and an output coupled to the control terminal of the first transistor.

18. The measurement circuit of claim 15, further comprising:

a first capacitive element having a first plate electrode coupled to the first input terminal of the comparator, and a second plate electrode;

a second switch having a first terminal for receiving a first voltage, and a second terminal coupled to the first input terminal of the comparator;

a second capacitive element having a first plate electrode coupled to the second plate electrode of the first capacitive element, and a second plate electrode coupled to a ground terminal;

a third switch having a first terminal for receiving a second voltage, and a second terminal coupled to the second plate electrode of the first capacitive element; and a fourth switch having a first terminal coupled to the second plate electrode of the first capacitive element, and a second terminal coupled to the circuit under test.

19. The measurement circuit of claim 15, wherein the first counter value is scanned out using a scan chain of the circuit under test.

20. The measurement circuit of claim 15, further comprising:

a first capacitive element having a first plate electrode coupled to the first input terminal of the comparator, and a second plate electrode coupled to a ground terminal; and a second switch having a first terminal coupled to the first plate electrode of the first capacitive element, and a second terminal coupled to the circuit under test.

* * * * *